United States Patent
Yang et al.

(10) Patent No.: US 10,520,807 B2
(45) Date of Patent: Dec. 31, 2019

(54) NANOIMPRINT TEMPLATE, A METHOD OF MAKING THE SAME AND APPLICATIONS THEREOF

(71) Applicant: Wuhan China Star Optoelectronics Technology Co., Ltd., Wuhan, Hubei (CN)

(72) Inventors: Yong Yang, Hubei (CN); Hongqing Cui, Hubei (CN)

(73) Assignee: WUHAN CHINA STAR OPTOELECTRONICS TECHNOLOGY CO., LTD., Wuhan (CN)

( * ) Notice: Subject to any disclaimer, the term of this patent is extended or adjusted under 35 U.S.C. 154(b) by 239 days.

(21) Appl. No.: 15/579,441

(22) PCT Filed: Nov. 21, 2017

(86) PCT No.: PCT/CN2017/112186
§ 371 (c)(1),
(2) Date: Dec. 4, 2017

(87) PCT Pub. No.: WO2019/085059
PCT Pub. Date: May 9, 2019

(65) Prior Publication Data
US 2019/0227429 A1   Jul. 25, 2019

(30) Foreign Application Priority Data
Oct. 31, 2017   (CN) .......................... 2017 1 1043937

(51) Int. Cl.
*G03F 7/00* (2006.01)
*G03F 7/11* (2006.01)
(Continued)

(52) U.S. Cl.
CPC ............ *G03F 7/0002* (2013.01); *B82Y 40/00* (2013.01); *G03F 7/11* (2013.01); *B29C 2059/023* (2013.01); *H01L 21/0271* (2013.01)

(58) Field of Classification Search
CPC .. G03F 7/0002; B29C 2059/023; B82Y 40/00
See application file for complete search history.

(56) References Cited

U.S. PATENT DOCUMENTS 7,441,745 B2 * 10/2008 Kawaguchi ............. B29C 33/40
                                                    106/38.2
9,354,512 B2 * 5/2016 Mizawa .................. B29C 33/56
(Continued)

FOREIGN PATENT DOCUMENTS

CN     101250266 A    8/2008
CN     101477304 A    7/2009
(Continued)

*Primary Examiner* — John A McPherson
(74) *Attorney, Agent, or Firm* — Hemisphere Law, PLLC; Zhigang Ma

(57) ABSTRACT

A nanoimprint template is provided, including a main template, a plurality of photoresist micro-structures arranged on the main template, and a fluororubber polymer layer coated on an outer layer of the photoresist micro-structures. The fluororubber polymer layer has a bonding function with the main template, so as to fixedly connect to the surface of the main template. The nanoimprint template can not only protect the photoresist microstructure therein, but also prevent the nanoimprint template from being deformed during operating, thereby improving the process quality. Moreover, the surface oil resistance and corrosion resistance of the nanoimprint template is improved, so that the surface has lower surface energy, which can effectively improve the degumming problem during operating. A manufacturing method of the nanoimprint template and the application thereof in manufacturing a microstructure substrate are also provided, the microstructure size and shape of the formed microstructure substrate can be ensured.

20 Claims, 3 Drawing Sheets

(51) Int. Cl.
 *B82Y 40/00* (2011.01)
 *H01L 21/027* (2006.01)
 *B29C 59/02* (2006.01)

(56) References Cited

U.S. PATENT DOCUMENTS

2002/0130444 A1 9/2002 Hougham
2005/0074697 A1* 4/2005 De Vittorio ............ B82Y 10/00
 430/311
2008/0061214 A1 3/2008 Lee et al.

FOREIGN PATENT DOCUMENTS

| | | |
|---|---|---|
| CN | 101668594 A | 3/2010 |
| CN | 102854741 A | 1/2013 |
| CN | 103576447 A | 2/2014 |
| EP | 1065533 A2 | 1/2001 |
| JP | 2010049745 A | 3/2010 |

* cited by examiner

NANOIMPRINT TEMPLATE, A METHOD OF MAKING THE SAME AND APPLICATIONS THEREOF

RELATED APPLICATIONS

The present application is a National Phase of International Application Number PCT/CN2017/12186, filed Nov. 21, 2017, and claims the priority of China Application No. 201711043937.7, filed Oct. 31, 2017.

FIELD OF THE DISCLOSURE

The present disclosure relates to a nanoimprint template technique. In particular, it relates to a nanoimprint template, a method of making the same, and a method of manufacturing a microstructure substrate by applying the nanoimprint template.

BACKGROUND

Due to economic reasons, the semiconductor industry is developing smaller size, such a technological advance led to the exponential growth of equipment costs. Due to cost increases, people pay more and more attention on nanoimprint technology (hereinafter referred to as NIL technology) this kind low cost graphics transfer technology. By avoiding the use of expensive light sources and projection optics, nanoimprint technology offers significant cost savings over traditional lithography methods.

NIL technology offers the economic advantages of low cost and high output due to the elimination of the costs of optical lithography masks and the use of optical imaging equipment. In addition, NIL technology can be used in a wide range of applications. including nanoelectronic components, biology or chemistry silicon laboratory, microchannel devices (micromixer, microreactor), ultra-high storage density disks, micro-optics and so on.

The widely applications of NIL technology is mainly in its realization of optical filters, anti-reflective, and antireflection such better optical performances. However, NIL technology is generally limited by its producing process, including master mold and soft film productions, imprinting process and etching process, etc. Wherein, during the imprinting process, there often exists some interaction between the mold material and the imprinted substrate material, resulting in the residual material or the deformation of the microstructure on the substrate during demolding, such that bringing more trouble to the subsequent etching. At present, there is not a good solution to the problems arising in the imprinting process, which has also become one of the bottlenecks hindering the development of NIL technology.

SUMMARY

In order to solve the problems in the prior art, the present invention provides a nanoimprint template and a method of manufacturing the same, the imprinting surface of the nanoimprint template exhibiting good oil resistance, excellent corrosion resistance and lower surface energy. Therefore, the degumming problem can be effectively improved during the nanoimprint process.

In order to achieve the above objectives, the present disclosure provides following technical solutions:

A nanoimprint template, comprises a main template, a plurality of photoresist microstructures disposed on the main template, and a fluororubber polymer layer wrapped on an outer surface of the photoresist microstructure; wherein the fluororubber polymer layer and the main template have a bonding function so that the fluororubber polymer layer is fixedly connected to a surface of the main template.

Furthermore, the fluororubber polymer layer has a thickness of 50 nm~100 nm.

Furthermore, a material of the fluororubber polymer layer has a structure as shown in Formula 1:

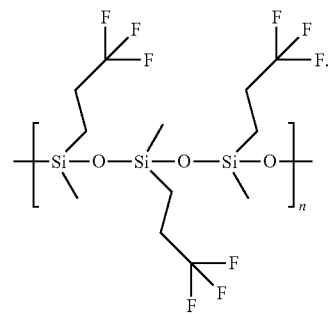

Furthermore, the fluororubber polymer layer has a grid structure.

Another objective of the present disclosure is to provide a method of manufacturing a nanoimprint template, comprising steps of:

S1, coating a photoresist layer on a main template and performing a development and etching treatment on the photoresist layer to form a plurality of photoresist microstructures on the main template;

S2, dipping the main template having the photoresist microstructures into an organic solution containing trimethyltris (3-fluoropropyl) cyclotrisiloxane and tetramethyltetravinylcyclotetrasiloxane, and forming a fluororubber polymer layer by wrapping an outer surface of the photoresist microstructures under a catalyzed polymerization of the trimethyltris (3-fluoropropyl) cyclotrisiloxane and the tetramethyltetravinylcyclotetrasiloxane active by a catalyst; wherein the fluororubber polymer layer is fixedly connected to a surface of the main template by a bonding function.

Furthermore, the fluororubber polymer layer has a thickness of 50 nm~100 nm.

Furthermore, the manufacturing method further comprises a step of: S3, vulcanizing the main template having the fluororubber polymer layer so that the fluororubber polymer layer forms a grid structure.

Furthermore, a material of the fluororubber polymer layer has a structure as shown in Formula 1:

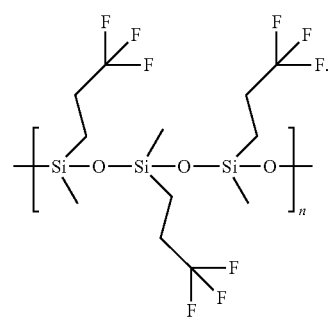

Yet another objective of the present disclosure is to provide a method of manufacturing a microstructure substrate, comprising steps of:

Q1, coating an imprinting adhesive layer on an imprinting substrate;

Q2, coating a layer of polytetrafluoroethylene powder on the imprinting adhesive layer, calcining and cooling the polytetrafluoroethylene membrane layer to form an isolation layer on the imprinting adhesive layer:

Q3: performing an imprinting process on the isolation layer by adopting a nanoimprint template in any one of claims 1 to 4 to form a mask on the imprinting substrate;

Q4, etching the imprinting substrate not masked by the mask, and removing the mask to form a microstructure substrate.

Furthermore, the step Q2 specifically comprises: spraying a layer of polytetrafluoroethylene powder having a thickness of 10 nm~30 nm on the imprinting adhesive layer; and calcining the polytetrafluoroethylene membrane layer at 200° C.~250° C., and cooling it to form the isolation layer on the imprinting adhesive layer.

The benefit are:

(1) The nanoimprint template according to the present disclosure is to wrap a layer of fluororubber polymer layer on the surface of a plurality of photoresist microstructures. In one aspect, the fluororubber polymer layer has a wrapping effect on the photoresist microstructures, meanwhile, the silicon atom group in the main chain of the fluororubber polymer layer material interacts with the silicon atom group in the main template to enhance the bonding force between the fluororubber polymer layer and the main template, thereby protecting the photoresist microstructures to prevent the nanoimprint template from being deformed during operation, and improving the process quality of the nanoimprint. In another aspect, the side chain of the fluororubber polymer layer material contains more fluorine atoms to improve the oil resistance and corrosion resistance of the imprinting surface of the nanoimprint template, so that the surface thereof has a lower surface energy, the problem of degumming can be effectively improved during the imprinting process.

(2) According to the method of manufacturing the nanoimprint template of the surface of the photoresist microstructures only by one-step catalytic polymerization reaction; and a high-temperature vulcanization treatment is then performed to the fluororubber polymer layer to form a grid structure of the fluororubber polymer layer, and further enhance the toughness and strength, so as to enhance the protective effect on the photoresist microstructure. The manufacturing method is simple and easy to operate.

(3) According to the method of manufacturing the microstructure substrate of the present disclosure, in one aspect, the surface to be imprinted is provided with anti-corrosion, high-lubricity and non-tackiness characters by disposing an additional isolation layer on the imprinting adhesive layer on the imprinting substrate. In combination with the low surface energy imprinting surface of the nanoimprint template described above, a smooth stripping characters during embossing is further ensured. In another aspect, the provision of the isolation layer can also protect the imprinting adhesive portion in the mask during subsequent etching is not over etched, and the size and shape of the microstructure of the formed microstructure substrate can be further ensured.

BRIEF DESCRIPTION OF THE DRAWINGS

For further understanding of the features and technical contents of the present disclosure, references are made to the following detailed description and accompanying drawings of the present disclosure.

DETAILED DESCRIPTION OF PREFERRED EMBODIMENTS

Figure 1:
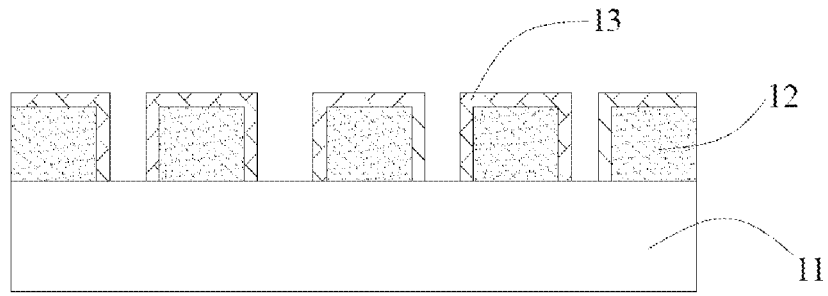
FIG. 1 is a schematic diagram of a nanoimprint template according to Embodiment 1 of the present disclosure.

Hereinafter, embodiments of the present disclosure will be described in detail with reference to the accompanying drawings. However, the disclosure may be embodied in many different forms and should not be construed as limited to the specific embodiments set forth herein. Rather, these embodiments are provided to explain the principles of the invention and its practical application to thereby enable those of ordinary skill in the art to understand various embodiments of the disclosure and various modifications as are suited to the particular use contemplated. In the drawings, the shapes and dimensions of elements may be exaggerated for clarity, and the same reference numerals will be used throughout to designate the same or similar elements.

Embodiment 1

The present disclosure provides an all new nanoimprint template, referring to FIG. 1, the nanoimprint template comprises main template 11, a plurality of photoresist microstructures 12 disposed on the main template 11, and a fluororubber polymer layer 13 wrapped on an outer surface of the photoresist microstructure 12.

Furthermore, a thickness of the fluororubber polymer layer 12 is 50 nm~100 nm.

Furthermore, a material of the fluororubber polymer layer 12 has a structure as shown in Formula 1:

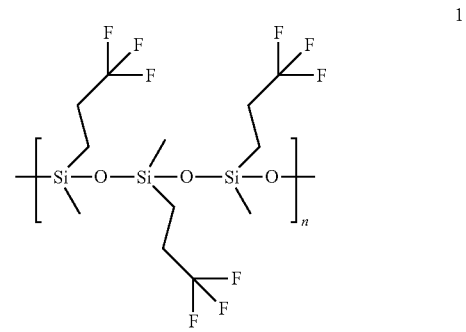

wherein, in Formula 1, n represents degree of polymerization, which does not specifically limit here.

As can be seen from the Formula 1, on the one hand, the silicon oxygen atom groups in the main chain of the material of the fluororubber polymer layer 13 can interact with the silicon oxygen atom groups in the main template main 11, and a bonding force is formed between the fluororubber polymer layer 13 and the main template 11, such that the fluororubber polymer layer 13 can cover the photoresist microstructure 12 and firmly adhere to the surface of the main template 11. Accordingly, the photoresist microstructures 12 of the nanoimprint template can maintain the existing shape and prevent deformation during operation, so as to improve the process quality of the nanoimprint.

On the other hand, the material of the fluororubber polymer layer 13 contains a large amount of fluorine atoms in the side chain, which can improve the oil resistance and the corrosion resistance of the imprinting surface of the nanoimprint template, so that the surface thereof has a lower surface energy, the degumming problem during e imprinting process is therefore effectively improved.

Preferably, the fluororubber polymer layer 13 has a grid structure. The grid structure can enhance the toughness and strength of the fluororubber polymer layer 13, so as to better protect the photoresist microstructures 12.

The method of manufacturing the nanoimprint template provided in this embodiment will be described in detail below with reference to the accompanying drawings.

Figure 2:
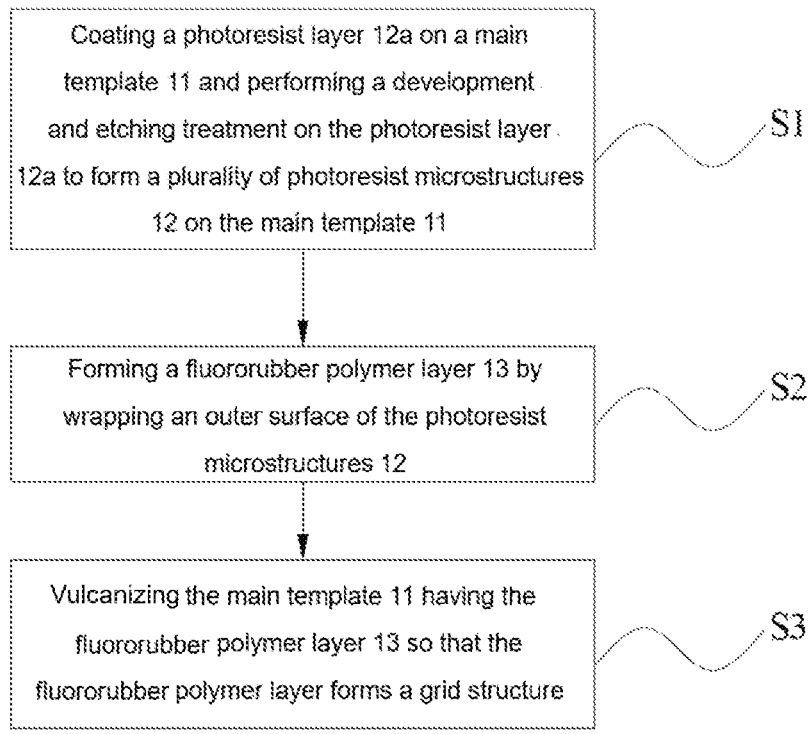
FIG. 2 is a flow chart for a manufacturing a nanoimprint template according to Embodiment 1 of the present disclosure.

Referring to FIG. 2, the method of manufacturing the nanoimprint template according the present embodiment comprises the following steps:

Step S1, coating a photoresist layer 12a on a main template 11 and performing a development and etching treatment on the photoresist layer 12a to form a plurality of photoresist microstructures 12 on the main template. The main template 11 is generally a silica substrate or a quartz substrate.

Figure 3:
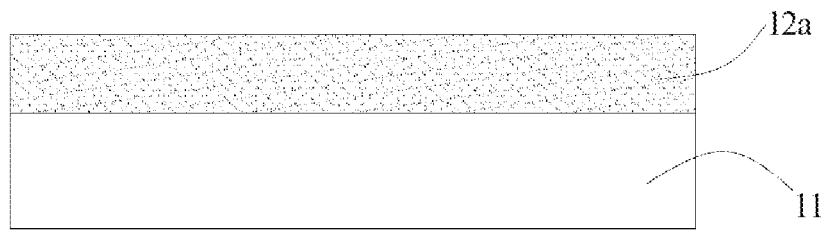
FIGS. 3-5 are schematic diagrams of a method for manufacturing a nanoimprint template according to Embodiment 1 of the present disclosure.
Figure 4:
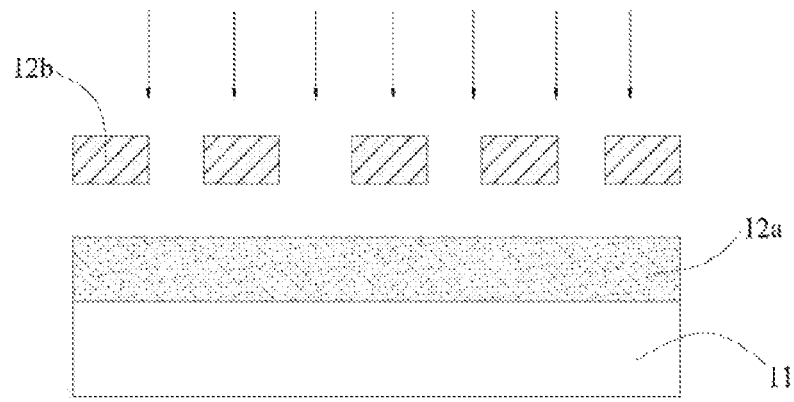
Figure 5:
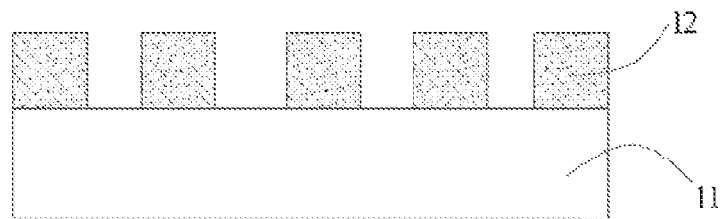

Specifically is coating a layer of photoresist on the main template 11 to form a photoresist layer 12a, as shown in FIG. 3; and then performing a development and etching treatment by a mask 12b to remove the resident photoresist, and forming a plurality of photoresist microstructures 12 on the main template 11, as shown in FIGS. 4 and 5, wherein in the FIG. 4, the arrows indicate the direction of light.

Step S2, forming a fluororubber polymer layer 13 by wrapping an outer surface of the photoresist microstructures 12.

Specifically is dipping the main template 11 having the photoresist microstructures 12 into an organic solution containing trimethyltris (3-fluoropropyl) cyclotrisiloxane and tetramethyltetravinylcyclotetrasiloxane, and forming a fluororubber polymer layer 13 by wrapping an outer surface of the photoresist microstructures 12 under a catalyzed polymerization of the trimethyltris (3-fluoropropyl) cyclotrisiloxane and the tetramethyltetravinylcyclotetrasiloxane active by a catalyst, so as to form the nanoimprint template as shown in FIG. 1.

Preferably, a thickness of the fluororubber polymer layer is 50 nm~100 nm.

Furthermore, a material of the fluororubber polymer layer 12 has a structure as shown in Formula 1:

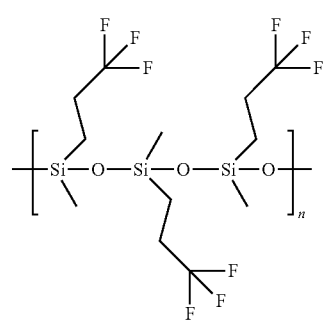

1 wherein the fluororubber polymer layer 13 is fixedly connected to a surface of the main template 11 by a bonding function.

Preferably, In order to further strengthen the toughness and strength of the fluororubber polymer layer 13, the above manufacturing method further comprises the following steps:

S3, vulcanizing the main template 11 having the fluororubber polymer layer 13 so that the fluororubber polymer layer 13 forms a grid structure.

Thus, the nanoimprint template according to the present embodiment not only prevents the photoresist microstructure 12 from deformation to maintain the existing shape during the imprinting operation, thereby improving the process quality of the nanoimprint; but also the imprinting surface of the imprinting template has a lower surface energy, so that the degumming problem can be effectively improved during imprinting.

Embodiment 2

The objective of the present embodiment is to provide an application of the nanoimprint template as described in the above Embodiment 1 on the nanoimprint technology, that is, to make the microstructure substrate by adopting the nanoimprint template in the above Embodiment 1.

Figure 6:
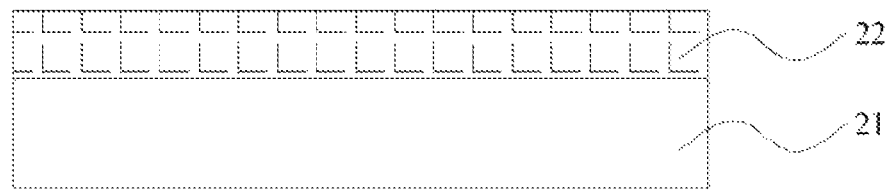
FIGS. 6-10 are schematic diagrams of a method for manufacturing a microstructure substrate according to Embodiment 2 of the present disclosure.

The method of manufacturing the microstructure substrate of the present embodiment will be described in detail below with reference to FIG. 6 to FIG. 10. The manufacturing method of the microstructure substrate according to this embodiment includes the following steps:

Step Q1, coating an imprinting adhesive layer 22 on an imprinting substrate 21, as shown in FIG. 6.

Figure 7:
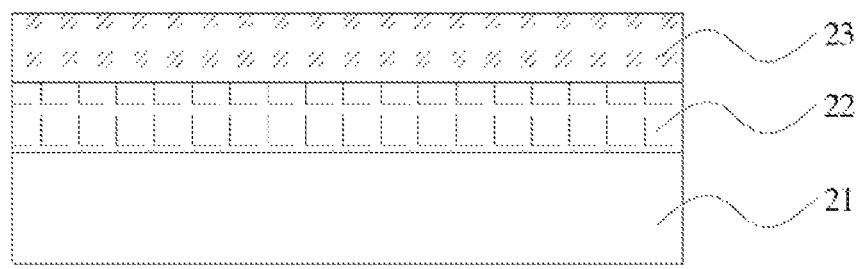

Q2, coating a layer of polytetrafluoroethylene powder on the imprinting adhesive layer 22, calcining and cooling the polytetrafluoroethylene membrane layer to form an isolation layer 23 on the imprinting adhesive layer 22, as shown in FIG. 7.

Specifically, a layer of polytetrafluoroethylene powder with a thickness of 10 nm~30 nm is sprayed on the imprinting adhesive layer 22 (not shown in the figure); and then the membrane layer of the polytetrafluoroethylene powder is calcined at 200° C.~250° C., after a cooling process, the isolation layer 23 is formed on the imprinting adhesive layer 22.

The polytetrafluoroethylene has a structure as shown in Formula 2 below:

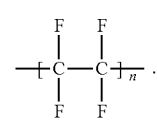

2 wherein, in Formula 1, n represents degree of polymerization, which does not specifically limit here.

As can be seen from Formula 2, the structure has a plurality of fluorine atoms, whereby the surface of the isolation layer 23 exhibits corrosion resistance, high lubricity and non-tackiness characters, that is, it has a low surface energy and is chemically stable. At the same time, fluorine atoms can also form hydrogen bonds with the hydrogen atoms in the imprinting adhesive layer 22 to cover above the imprinting adhesive layer 22 more firmly.

Figure 8:
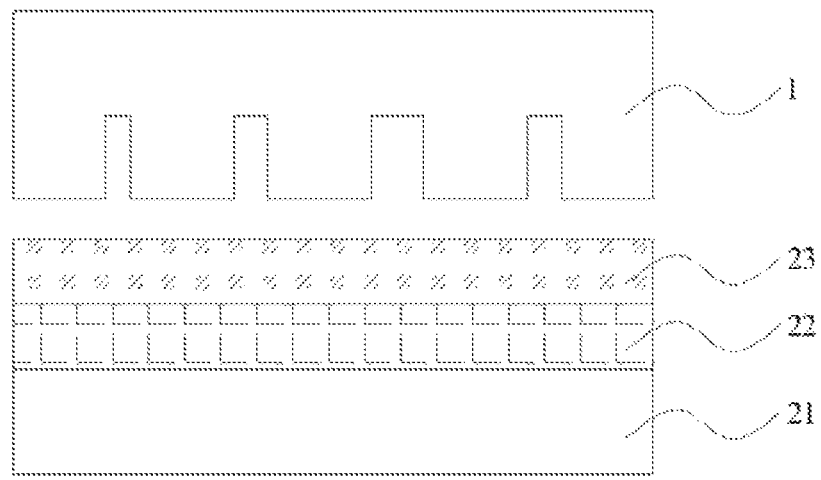
Figure 9:
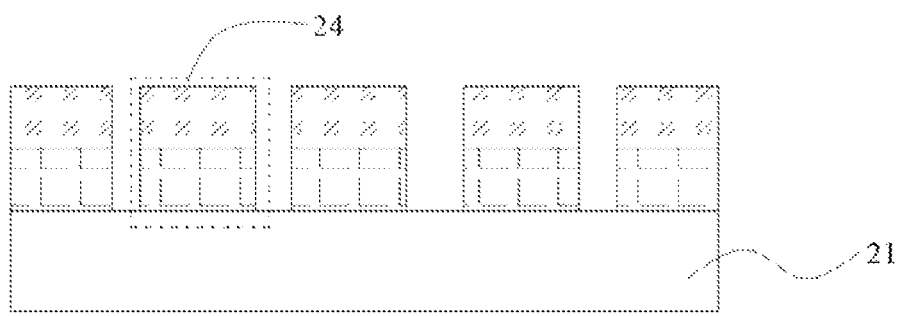
Figure 10:
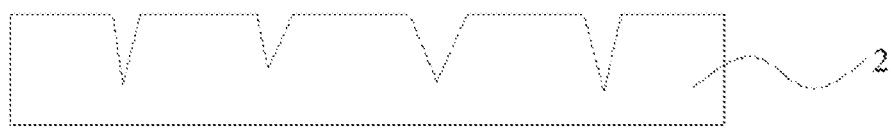

Step Q3, performing an imprinting process on the isolation layer 23 by adopting a nanoimprint template 1, and forming a mask 24 on the imprinting substrate 21, as show n in FIGS. 8 and 9.

Specifically, the nanoimprint template 1 used in this step is the nanoimprint template in the above Embodiment 1, so that the fluororubber polymer layer in the nanoimprint template 1 faces the isolation layer 23.

Step Q4, etching the imprinting substrate 21 not masked by the mask 24, and removing the mask 24 to form a microstructure substrate 2, as shown in FIG. 2.

The imprinting substrate 21 that is not covered by the mask 24 is generally etched by reactive ion etching (RIE) or reactive coupled plasma etching (ICP), the mask 24 is then removed by dissolving the organic solvent that can dissolve the corresponding imprinting adhesive material, thereby obtaining the microstructure substrate 2.

In the method of manufacturing a microstructure substrate provided in this embodiment, an isolation layer 23 is further disposed on the imprinting adhesive layer 22 of the imprinting substrate 21, the isolation layer 23 is used to form a low surface energy to-be-printed surface, which in turn incorporates the low surface energy imprinting surface of the used nanoimprint template 1 to further ensure smooth release during imprinting. On the other hand, the provision of the isolation layer 23 in the subsequent etching process protects the mask 24 from over etched, the size and shape of the microstructure of the formed microstructure substrate 2 can be further ensured.

Finally, it should be noted that the above embodiments are merely illustrative of the technical solutions of the present disclosure and are not intended to be limiting thereof. For the person skilled in the art of the disclosure, without departing from the concept of the disclosure, simple deductions or substitutions can be made and should be included in the protection scope of the disclosure.

What is claimed is:

1. A nanoimprint template, comprising a main template, a plurality of photoresist microstructures disposed on the main template, and a fluororubber polymer layer wrapped on an outer surface of the photoresist microstructure; wherein the fluororubber polymer layer and the main template have a bonding function so that the fluororubber polymer layer is fixedly connected to a surface of the main template.

2. The nanoimprint template according to claim 1, wherein the fluororubber polymer layer has a thickness of 50 nm~100 nm.

3. The nanoimprint template according to claim 2, wherein a material of the fluororubber polymer layer has a structure as shown in Formula 1:

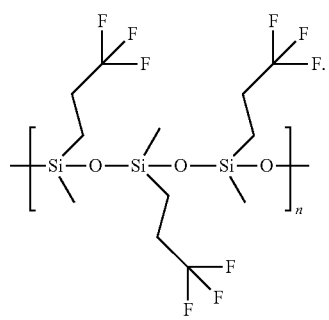

wherein n represents a degree of polymerization.

4. The nanoimprint template according to claim 1, wherein a material of the fluororubber polymer layer has a structure as shown in Formula 1:

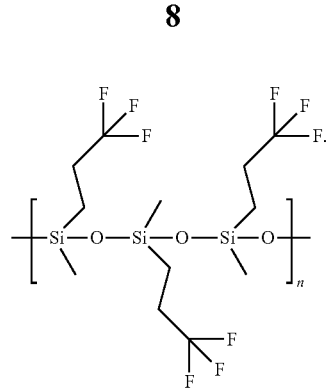

wherein n represents a degree of polymerization.

5. The nanoimprint template according to claim 1, wherein the fluororubber polymer layer has a grid structure.

6. A method of manufacturing a microstructure substrate, comprising following steps of:
   Q1, coating an imprinting adhesive layer on an imprinting substrate;
   Q2, coating a layer of polytetrafluoroethylene powder on the imprinting adhesive layer, calcining and cooling the polytetrafluoroethylene membrane layer to form an isolation layer on the imprinting adhesive layer;
   Q3: performing an imprinting process on the isolation layer by adopting a nanoimprint template in claim 1 to form a mask on the imprinting substrate;
   Q4, etching the imprinting substrate not masked by the mask, and removing the mask to form a microstructure substrate.

7. The method of manufacturing a microstructure substrate according to claim 6, wherein the fluororubber polymer layer has a thickness of 50 nm~100 nm.

8. The method of manufacturing a microstructure substrate according to claim 7, wherein a material of the fluororubber polymer layer has a structure as shown in Formula 1:

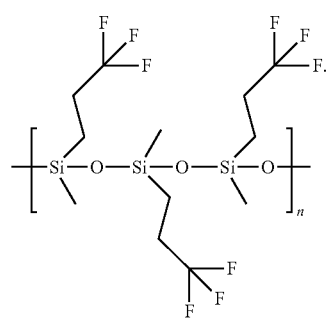

wherein n represents a degree of polymerization.

9. The method of manufacturing a microstructure substrate according to claim 8, wherein the step Q2 specifically comprises:
   spraying a layer of polytetrafluoroethylene powder having a thickness of 10 nm~30 nm on the imprinting adhesive layer;
   calcining the polytetrafluoroethylene membrane layer at 200° C.~250° C., and cooling it to form the isolation layer on the imprinting adhesive layer.

10. The method of manufacturing a microstructure substrate according to claim 7, wherein the step Q2 specifically comprises:

spraying a layer of polytetrafluoroethylene powder having a thickness of 10 nm~30 nm on the imprinting adhesive layer;

calcining the polytetrafluoroethylene membrane layer at 200° C.~250° C., and cooling it to form the isolation layer on the imprinting adhesive layer.

11. The method of manufacturing a microstructure substrate according to claim 6, wherein a material of the fluororubber polymer layer has the structure as shown in Formula 1:

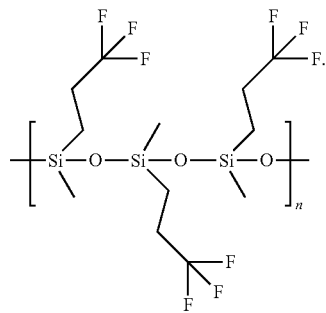

wherein n represents a degree of polymerization.

12. The method of manufacturing a microstructure substrate according to claim 11, wherein the step Q2 specifically comprises:

spraying a layer of polytetrafluoroethylene powder having a thickness of 10 nm~30 nm on the imprinting adhesive layer;

calcining the polytetrafluoroethylene membrane layer at 200° C.~250° C., and cooling it to form the isolation layer on the imprinting adhesive layer.

13. The method of manufacturing a microstructure substrate according to claim 6, wherein the fluororubber polymer layer has a grid structure.

14. The method of manufacturing a microstructure substrate according to claim 13, wherein the step Q2 specifically comprises:

spraying a layer of polytetrafluoroethylene powder having a thickness of 10 nm~30 nm on the imprinting adhesive layer;

calcining the polytetrafluoroethylene membrane layer at 200° C.~250° C., and cooling it to form the isolation layer on the imprinting adhesive layer.

15. A method of manufacturing a nanoimprint template, comprising following steps of:

S1, coating a photoresist layer on a main template and performing a development and etching treatment on the photoresist layer to form a plurality of photoresist microstructures on the main template;

S2, dipping the main template having the photoresist microstructures into an organic solution containing trimethyltris (3-fluoropropyl) cyclotrisiloxane and tetramethyltetravinylcyclotetrasiloxane, and forming a fluororubber polymer layer by wrapping an outer surface of the photoresist microstructures under a catalyzed polymerization of the trimethyltris (3-fluoropropyl) cyclotrisiloxane and the tetramethyltetravinylcyclotetrasiloxane active by a catalyst; wherein the fluororubber polymer layer is fixedly connected to a surface of the main template by a bonding function.

16. The method of manufacturing a nanoimprint template according to claim 15, wherein the fluororubber polymer layer has a thickness of 50 nm~100 nm.

17. The method of manufacturing a nanoimprint template according to claim 16, further comprising a step of:

S3, vulcanizing the main template having the fluororubber polymer layer so that the fluororubber polymer layer forms a grid structure.

18. The method of manufacturing a nanoimprint template according to claim 16, wherein s material of the fluororubber polymer layer has a structure as shown in Formula 1:

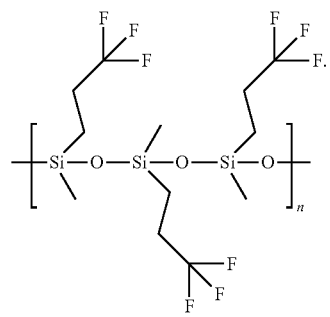

wherein n represents a degree of polymerization.

19. The method of manufacturing a nanoimprint template according to claim 15, further comprising a step of:

S3, vulcanizing the main template having the fluororubber polymer layer so that the fluororubber polymer layer forms a grid structure.

20. The method of manufacturing a nanoimprint template according to claim 15, wherein a material of the fluororubber polymer layer has a structure as shown in Formula 1:

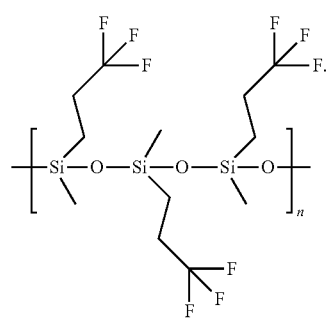

wherein n represents a degree of polymerization.

* * * * *